United States Patent
Hafez et al.

(10) Patent No.: US 10,892,261 B2
(45) Date of Patent: Jan. 12, 2021

(54) METAL RESISTOR AND SELF-ALIGNED GATE EDGE (SAGE) ARCHITECTURE HAVING A METAL RESISTOR

(71) Applicant: Intel Corporation, Santa Clara, CA (US)

(72) Inventors: Walid M. Hafez, Portland, OR (US); Roman W. Olac-Vaw, Hillsboro, OR (US); Joodong Park, Portland, OR (US); Chen-Guan Lee, Portland, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/318,107

(22) PCT Filed: Sep. 29, 2016

(86) PCT No.: PCT/US2016/054543
§ 371 (c)(1),
(2) Date: Jan. 15, 2019

(87) PCT Pub. No.: WO2018/063259
PCT Pub. Date: Apr. 5, 2018

(65) Prior Publication Data
US 2020/0066712 A1    Feb. 27, 2020

(51) Int. Cl.
*H01L 27/088* (2006.01)
*H01L 27/06* (2006.01)
(Continued)

(52) U.S. Cl.
CPC .. *H01L 27/0629* (2013.01); *H01L 21/823431* (2013.01); *H01L 28/20* (2013.01);
(Continued)

(58) Field of Classification Search
CPC ............ H01L 27/0886; H01L 27/1211; H01L 29/66795; H01L 29/785; H01L 29/7851
See application file for complete search history.

(56) References Cited

U.S. PATENT DOCUMENTS

2013/0234292 A1* 9/2013 Wei ..................... H01L 23/5228
257/536
2013/0277757 A1 10/2013 Yuan et al.
(Continued)

OTHER PUBLICATIONS

International Search Report and Written Opinion for International Patent Application No. PCT/US2016/054543 dated Jun. 27, 2017, 14 pgs.

*Primary Examiner* — Hoai V Pham
(74) *Attorney, Agent, or Firm* — Schwabe, Williamson & Wyatt, P.C.

(57) ABSTRACT

Metal resistors and self-aligned gate edge (SAGE) architectures having metal resistors are described. In an example, a semiconductor structure includes a plurality of semiconductor fins protruding through a trench isolation region above a substrate. A first gate structure is over a first of the plurality of semiconductor fins. A second gate structure is over a second of the plurality of semiconductor fins. A gate edge isolation structure is laterally between and in contact with the first gate structure and the second gate structure. The gate edge isolation structure is on the trench isolation region and extends above an uppermost surface of the first gate structure and the second gate structure. A metal layer is on the gate edge isolation structure and is electrically isolated from the first gate structure and the second gate structure.

15 Claims, 11 Drawing Sheets

(51) Int. Cl.
*H01L 21/8234* (2006.01)
*H01L 49/02* (2006.01)
*H01L 29/66* (2006.01)
*H01L 29/78* (2006.01)

(52) U.S. Cl.
CPC .. *H01L 29/66545* (2013.01); *H01L 29/66795* (2013.01); *H01L 29/785* (2013.01)

(56) References Cited

U.S. PATENT DOCUMENTS

| | | | |
|---|---|---|---|
| 2014/0246730 A1* | 9/2014 | Hung | H01L 28/20 257/379 |
| 2015/0194427 A1 | 7/2015 | Sengupta et al. | |
| 2015/0357247 A1 | 12/2015 | Chen et al. | |
| 2016/0005735 A1 | 1/2016 | Costrini et al. | |
| 2016/0148832 A1 | 5/2016 | Leobandung et al. | |

* cited by examiner

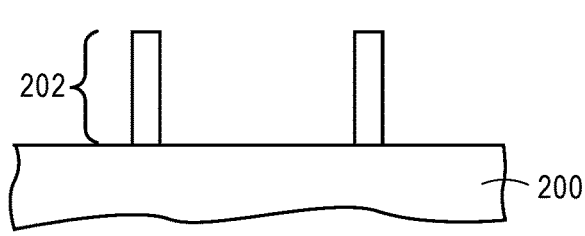
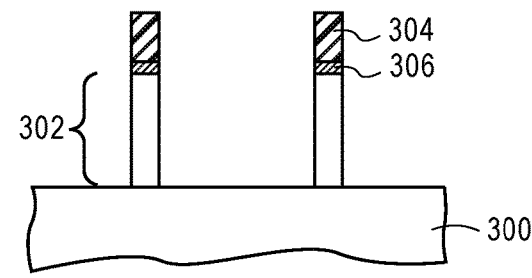
FIG. 2A    FIG. 3A
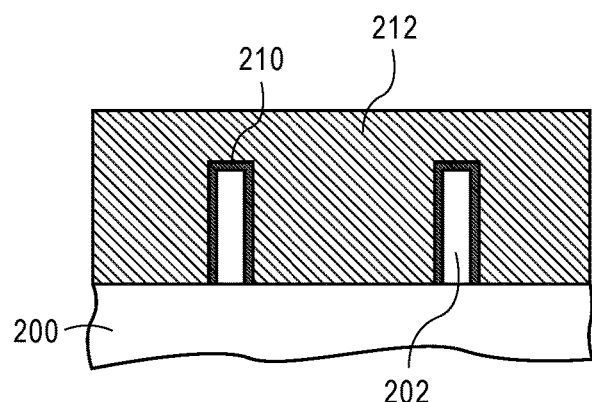
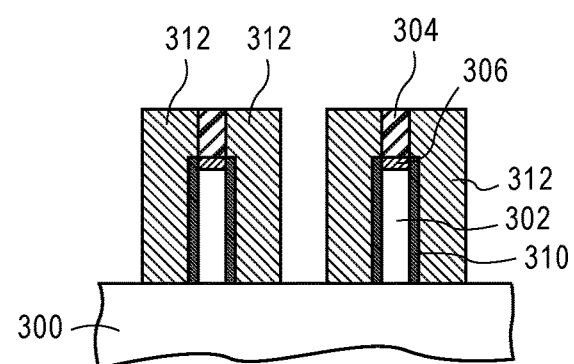
FIG. 2B    FIG. 3B

METAL RESISTOR AND SELF-ALIGNED GATE EDGE (SAGE) ARCHITECTURE HAVING A METAL RESISTOR

CROSS-REFERENCE TO RELATED APPLICATION

This patent application is a U.S. National Phase Application under 35 U.S.C. § 371 of International Application No. PCT/US2016/054543, filed Sep. 29, 2016, entitled "METAL RESISTOR AND SELF-ALIGNED GATE EDGE (SAGE) ARCHITECTURE HAVING A METAL RESISTOR," which designates the United States of America, the entire disclosure of which is hereby incorporated by reference in its entirety and for all purposes.

TECHNICAL FIELD

Embodiments of the invention are in the field of semiconductor devices and processing and, in particular, metal resistors and self-aligned gate edge (SAGE) architectures having metal resistors.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features. Additionally, the constraints on including passive features among active devices have increased.

BRIEF DESCRIPTION OF THE DRAWINGS

FIGS. 2A-2D illustrate cross-sectional views of process operations of significance in a conventional finFET or tri-gate process fabrication scheme.

FIGS. 3A-3D illustrate cross-sectional views of process operations of significance in a self-aligned gate edge (SAGE) process fabrication scheme for finFET or tri-gate devices.

DESCRIPTION OF THE EMBODIMENTS

Figure 1:
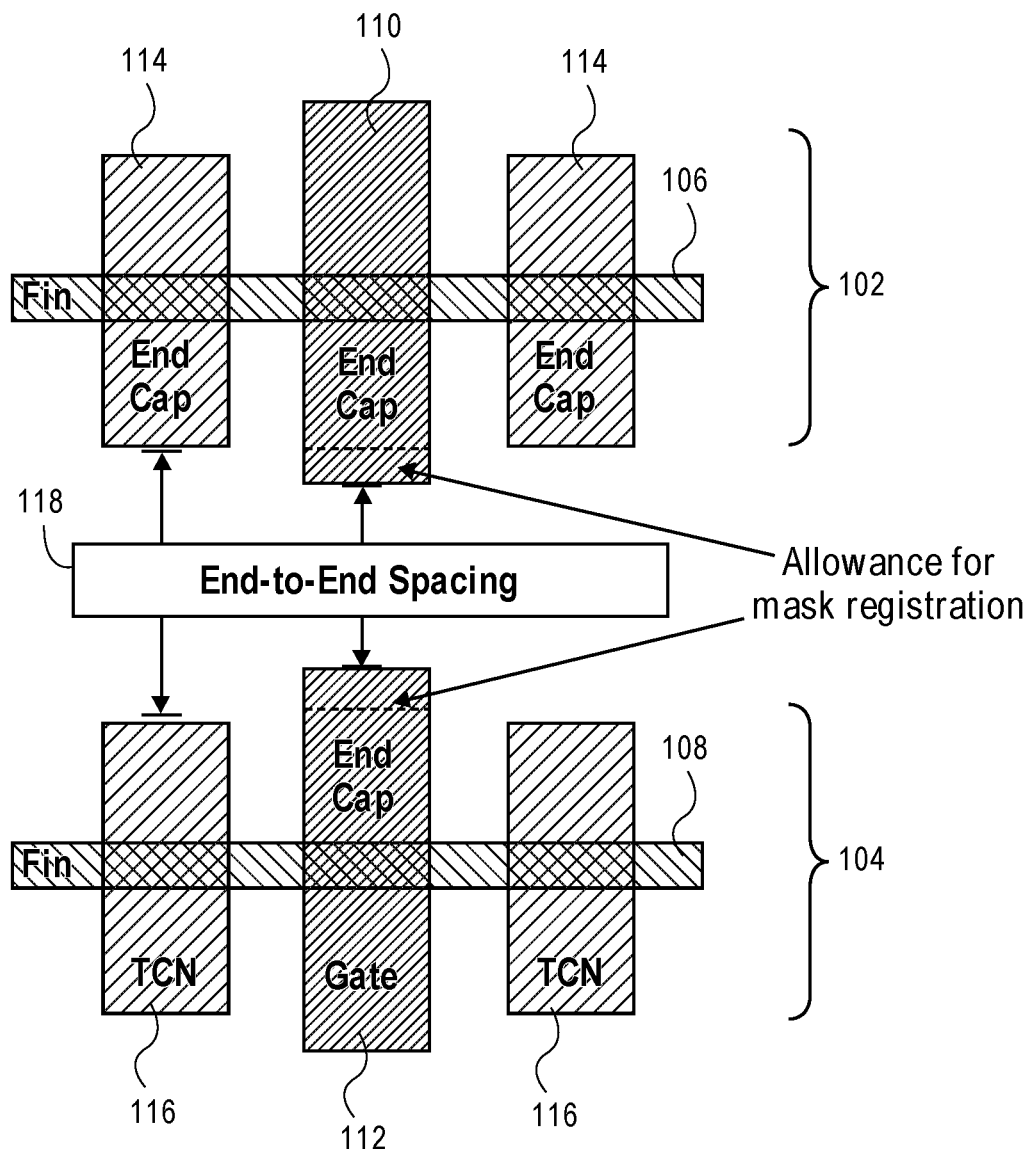
FIG. 1 illustrates a plan view of a layout including fin-based semiconductor devices accommodating end-to-end spacing.

Metal resistors and self-aligned gate edge (SAGE) architectures having metal resistors, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments are directed to the fabrication of metal resistors using self-aligned gate endcap (SAGE) architecture. In an embodiment, such precision resistors are implanted as a fundamental component of a system-on-chip (SoC) technology, due to the high speed IOs required for faster data transfer rates. Such resistors may enable the realization of high speed analog circuitry (such as CSI/SERDES) and scaled IO architectures due to the characteristics of having low variation and near-zero temperature coefficients.

To provide context, traditional resistors used in current process technologies typically fall in one of two classes: general resistors or precision resistors. General resistors, such as trench contact resistors, are cost-neutral but may suffer from high variation due to variations inherent in the fabrication methods utilized or the associated large temperature coefficients of the resistors, or both. Precision resistors may alleviate the variation and temperature coefficient issues, but often at the expense of higher process cost and an increased number of fabrication operations required. The integration of polysilicon precision resistors is proving increasingly difficult in high-k/metal gate process technologies.

In accordance with embodiments, self-aligned gate edge (SAGE)-integrated thin film resistor (TFR) are described. In one embodiment, such resistors have a near-zero temperature coefficient. In one embodiment, such resistors exhibit reduced variation from dimensional control.

As a foundation, one or more embodiments of the present invention are directed to semiconductor structures or devices having one or more gate edge structures (e.g., as gate isolation regions) of gate electrodes of the semiconductor structures or devices. One or more embodiments are directed to the fabrication of local interconnects for such gate electrode structures. Additionally, methods of fabricating gate edge isolation structures in a self-aligned manner are also described. In one or more embodiments, self-aligned gate edge structures are fabricated for logic transistors based on complementary metal oxide semiconductor (CMOS) devices.

To provide context, scaling of gate endcap and trench contact (TCN) endcap regions are important contributors towards improving transistor layout area and density. Gate and TCN endcap regions refer to gate and TCN overlap of the diffusion region/fins of semiconductor devices. As an example, FIG. 1 illustrates a plan view of a layout 100 including fin-based semiconductor devices accommodating end-to-end spacing. Referring to FIG. 1, first 102 and second 104 semiconductor devices are based on semiconductor fins 106 and 108, respectively. Each device 102 and 104 has a gate electrode 110 or 112, respectively. Additionally, each device 102 and 104 has trench contacts (TCNs) 114 and 116, respectively, at source and drain regions of the fins 106 and 108, respectively. The gate electrodes 110 and 112 and the TCNs 114 and 116 each have an end cap region, which is located off of the corresponding fins 106 and 108, respectively.

Referring again to FIG. 1, typically, gate and TCN endcap dimensions must include an allowance for mask registration error to ensure robust transistor operation for worst case mask mis-registration, leaving an end-to-end spacing 118. Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present invention, approaches are described which provide for self-aligned gate endcap and TCN overlap of a semiconductor fin without any need to allow for mask registration. In one such embodiment, a disposable spacer is fabricated on the semiconductor fin edges which determines the gate endcap and the contact overlap dimensions. The spacer defined endcap process enables the gate and TCN endcap regions to be self-aligned to the semiconductor fin and, therefore, does not require extra endcap length to account for mask mis-registration. Furthermore, approaches described herein do not require lithographic patterning at previously required stages since the gate and TCN endcap/overlap dimensions remain fixed, leading to improvement (i.e., reduction) in device to device variability in electrical parameters.

In order to provide a side-by-side comparison, FIGS. 2A-2D illustrate cross-sectional views of process operations of significance in a conventional finFET or tri-gate process fabrication scheme, while FIGS. 3A-3D illustrate cross-sectional views of process operations of significance in a self-aligned gate edge (SAGE) process fabrication scheme for finFET or tri-gate devices, in accordance with an embodiment of the present invention.

Referring to FIGS. 2A and 3A, a bulk semiconductor substrate 200 or 300, such as a bulk single crystalline silicon substrate is provided having fins 202 or 302, respectively, etched therein. In an embodiment, the fins are formed directly in the bulk substrate 200 or 300 and, as such, are formed continuous with the bulk substrate 200 or 300. It is to be appreciated that within the substrate 200 or 300, shallow trench isolation structures may be formed between fins. Referring to FIG. 3A, a hardmask layer 304, such as a silicon nitride hardmask layer, and a pad oxide layer 306, such as a silicon dioxide layer, remain atop fins 302 following patterning to form the fins 302. By contrast, referring to FIG. 2A, such a hardmask layer and pad oxide layer have been removed.

Referring to FIG. 2B, a dummy or permanent gate dielectric layer 210 is formed on the exposed surfaces of the semiconductor fins 202, and a dummy gate layer 212 is formed over the resulting structure. By contrast, referring to FIG. 3B, a dummy or permanent gate dielectric layer 310 is formed on the exposed surfaces of the semiconductor fins 302, and dummy spacers 312 are formed adjacent to the resulting structure.

Figure 2C:
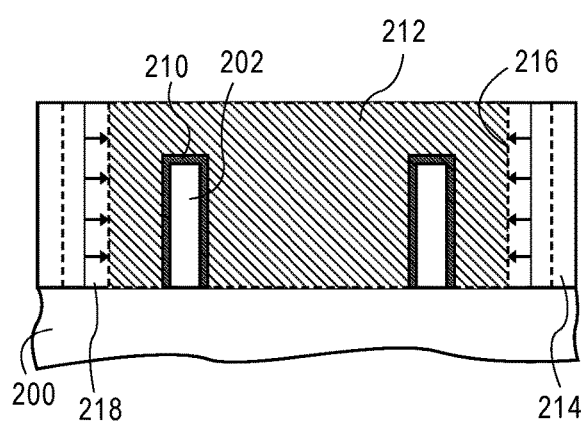

Referring to FIG. 2C, gate endcap cut patterning is performed and isolation regions 214 are formed at the resulting patterned dummy gate ends 216. In the conventional process scheme, a larger gate endcap must be fabricated to allow for gate mask mis-registration, as depicted by the arrowed regions 218. By contrast, referring to FIG. 3C, self-aligned isolation regions 314 are formed by providing an isolation layer over the structure of FIG. 3B, e.g., by deposition and planarization. In one such embodiment, the self-aligned gate endcap process does not require extra space for mask registration, as compared in FIGS. 2C and 3C.

Figure 2D:
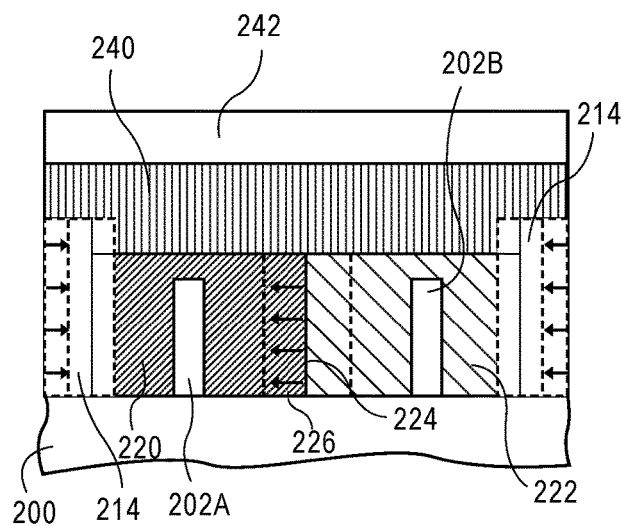

Referring to FIG. 2D, the dummy gate electrode 212 of FIG. 2C is replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 220 over a first semiconductor fin 202A and to provide a P-type gate electrode 222 over a second semiconductor fin 202B. The N-type gate electrode 220 and the P-type gate electrode 222 are formed between the gate edge isolations structures 214, but form a P/N junction 224 where they meet. The exact location of the P/N junction 224 may vary, depending on mis-registration, as depicted by the arrowed region 226.

Figure 3C:
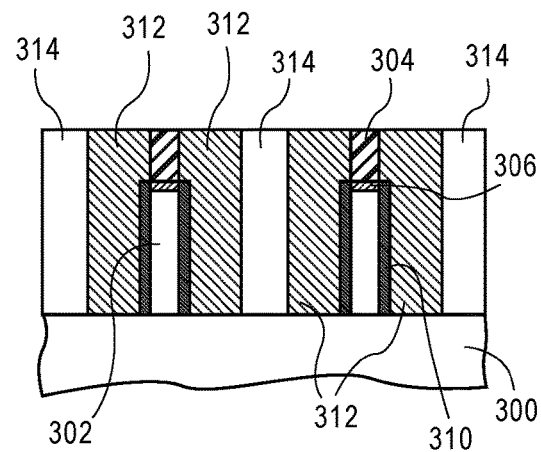
Figure 3D:
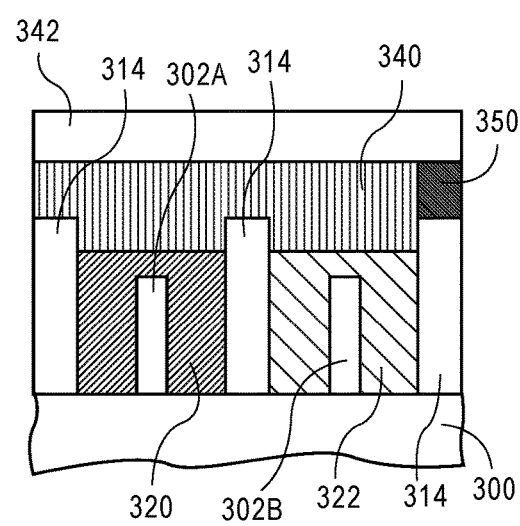

By contrast, referring to FIG. 3D, the hardmask layer 304 and pad oxide layer 306 are removed, and the dummy spacers 314 of FIG. 3C are replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 320 over a first semiconductor fin 302A and to provide a P-type gate electrode 322 over a second semiconductor fin 302B. The N-type gate electrode 320 and the P-type gate electrode 322 are formed between, and are also separated by, the gate edge isolations structures 314.

Referring again to FIG. 2D, a local interconnect 240 may be fabricated to contact N-type gate electrode 220 and P-type gate electrode 322 to provide a conductive path around the P/N junction 224. Likewise, referring to FIG. 3D, a local interconnect 340 may be fabricated to contact N-type gate electrode 320 and P-type gate electrode 322 to provide a conductive path over the intervening isolation structure 314 there between. Referring to both FIGS. 2D and 3D, a hardmask 242 or 342 may be formed on the local interconnect 240 or 340, respectively.

Referring to FIG. 3D in particular, in an embodiment, the continuity of the local interconnect 340 is interrupted by a dielectric plug 350 in cases where a break in electrical contact along a gate line are needed. As used, herein, the term "plug" is used to refer to a non-conductive space or interruption of a metal or otherwise conductive structure, such as an interruption of a local interconnect feature.

In accordance with one or more embodiments of the present invention, a self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Furthermore, a flexible fin-height (e.g., multi Hsi) process may enable independent optimization of different cells for power and performance. An integrated process flow enabling both features may be implemented to meet scaling and performance challenges for future CMOS technology. Embodiments described herein may involve the fabrication of gate edge isolation structures, which may also be referred to as gate walls or SAGE walls.

In accordance with one or more embodiments of the present invention, an integrated precision resistor is fabricated within a highly-scaled SAGE transistor architecture. It is to be appreciated that traditional resistors used in high-k/metal gate process technologies are typically tungsten trench contacts (TCN), well resistors, polysilicon precision resistors, or metal thin-film resistors (TFR). Such resistors either add process cost or complexity, or suffer from high variation and poor temperature coefficients due to variations in the fabrication processes used. By contrast, in an embodiment, fabrication of a SAGE-integrated thin film resistor enables a cost-neutral, good (close to zero) temperature coefficient, and low variation alternative to known approaches.

More specifically, in accordance with one or more embodiments of the present invention, a topographical feature of a SAGE transistor architecture is used as an embedded resistor. For example, in a SAGE architecture, local interconnects (LI) are typically used to connect adjacent transistors by routing metal over the SAGE walls which are isolating the transistors. In one embodiment, a precision resistor is fabricated on a SAGE wall. In a specific embodiment, such an approach enables very high density integration of a passive component such as a precision resistor.

Figure 4:
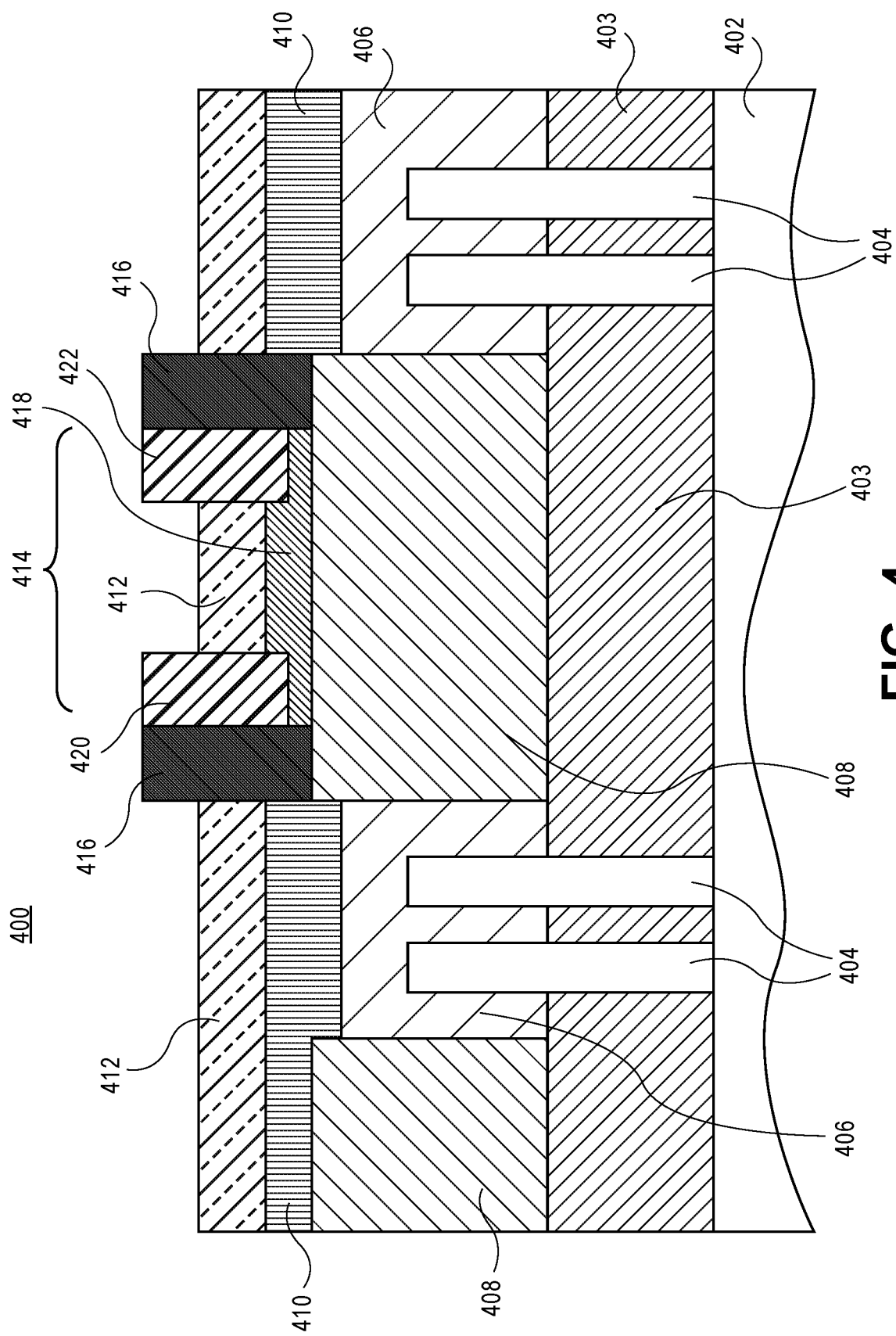
FIG. 4 illustrates a cross-sectional view of a semiconductor structure including a self-aligned gate edge (SAGE)-integrated thin film resistor (TFR), as taken through a fin cut perspective, in accordance with an embodiment of the present invention.

In an exemplary implementation, FIG. 4 illustrates a cross-sectional view of a semiconductor structure 400 including a self-aligned gate edge (SAGE)-integrated thin film resistor (TFR), as taken through a fin cut perspective, in accordance with an embodiment of the present invention.

Referring to FIG. 4, the semiconductor structure 400 includes a plurality of semiconductor fins 404 above a substrate 402. In one embodiment, the plurality of semiconductor fins 404 is continuous with and protrudes from the substrate 400, through and isolation region 403, as is depicted. A gate stack 406, which may include a gate electrode and gate dielectric layer is over a grouping of one or more of the plurality of semiconductor fins 404. For example, two gate stacks 406 are depicted, each formed over a pair of semiconductor fins 404. Self-aligned gate edge (SAGE) walls 408 laterally separate adjacent gate structures 406. Local interconnects 410 may be formed above the gate electrodes 406 and, in some cases, over one or more of the Sage walls 408. A dielectric capping layer 412 may be formed over the local interconnects 410, as is depicted.

Referring again to FIG. 4, a thin film resistor (TFR) 414 is included in the SAGE architecture of the semiconductor structure 400. The TFR 414 includes a metal layer 418, also referred to as a metal resistor layer. In an embodiment, the metal layer 418 is formed from the same layer used to form the local interconnects 410. For example, in one embodiment, a continuous metal layer is firmed, and then local interconnect regions are defined by dielectric plugs (as described in association with FIG. 3D) and the metal layer 418 of the TFR 414 is isolated by dielectric plugs 416, as is depicted. However, in other embodiments, the metal layer 418 is formed from a different layer (e.g., different in composition and/or different in timing of deposition) used to form the local interconnects 410.

In an embodiment, the metal layer 418 of the TFR 414 is also covered by dielectric capping layer 412. In on such embodiment, the dielectric plugs 416 are formed through the dielectric capping layer 412. An anode contact 420 and a cathode contact 422 are electrically connected to the metal layer 418 of the TFR 414. In one embodiment, the anode contact 420 and a cathode contact 422 are or include a pair of via contacts (VCN). In one embodiment, the anode contact 420 and a cathode contact 422 are formed through the dielectric capping layer 412.

Thus, in accordance with an embodiment of the present invention, a TFR 414 is formed from a metal layer 418 formed above a SAGE wall 408. In an embodiment, the metal layer 418 is composed of a material suitable to provide a near-zero temperature coefficient, in that the resistance of the metal layer 418 does change significantly over a range of operating temperatures of the TFR 414. In an embodiment, the metal layer 418 is a titanium nitride layer. In another embodiment, the metal layer 418 is a tungsten metal layer. It is to be appreciated that other metals may be used for a TFR metal in place of, or in combination with, titanium nitride (TiN) or tungsten (W). In an embodiment, the metal layer 418 has a thickness approximately in the range of 1-100 nanometers. In an embodiment, the metal layer 418 has a resistivity approximately in the range of 100-100,000 ohms/square. It is to be appreciated that a width of the metal layer 418 of the TFR 414 (as taken in the direction into and out of the page of Figure) can be modulated through the associated gate length of the gate stack 406.

Figure 5A:
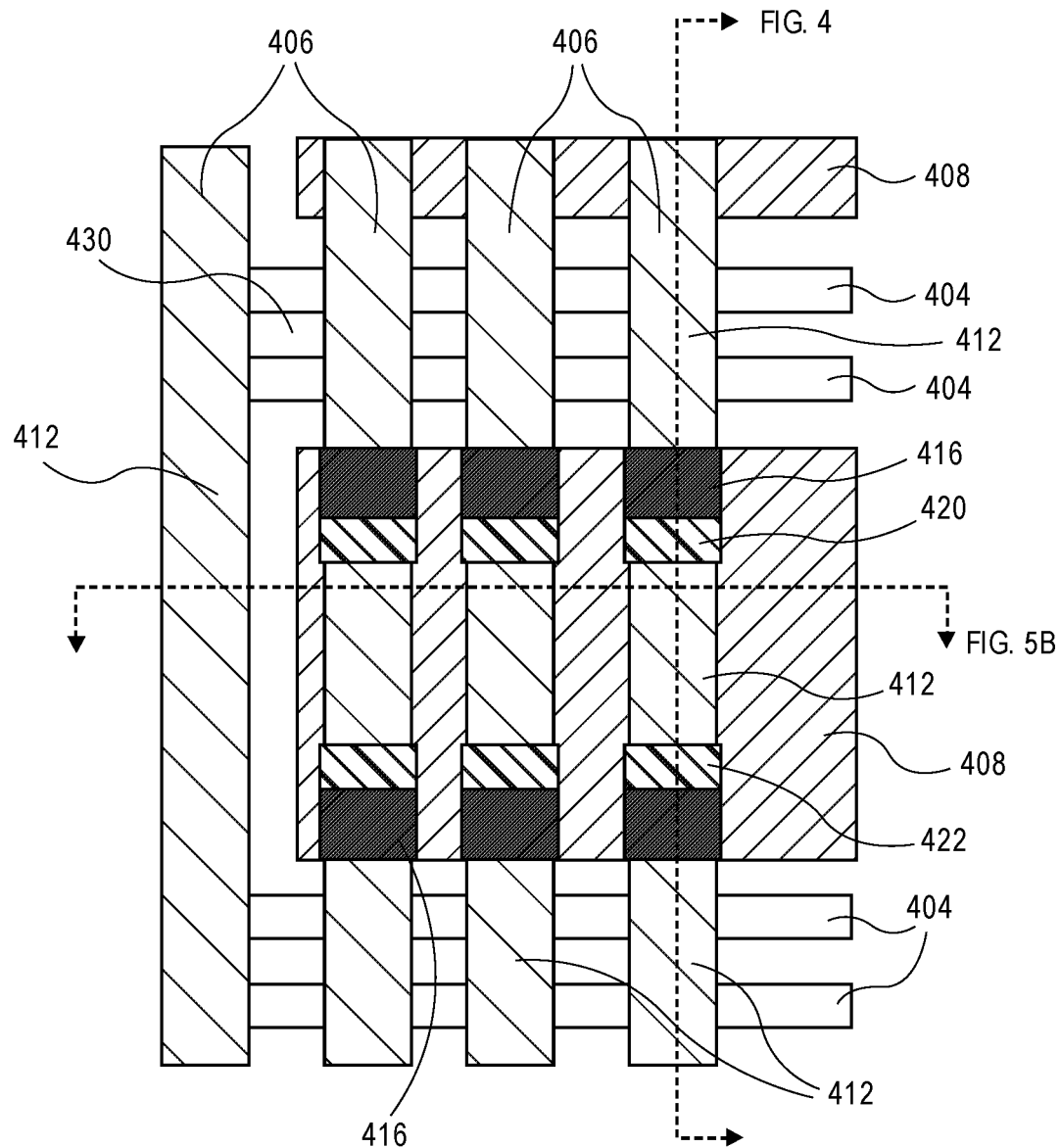
FIG. 5A illustrates a plan view of one possible semiconductor structure of FIG. 4, in accordance with an embodiment of the present invention.

FIG. 5A illustrates a plan view of one possible semiconductor structure of FIG. 4, in accordance with an embodiment of the present invention. From the plan perspective shown, the cross-sectional cuts of FIGS. 4 and 5B are shown.

Referring to FIG. 5A, two pairs of fins 404 are shown with lines of dielectric capping layer 412 overlying the fins 404 in an orthogonal direction. Although not seen, some regions 406 where gate stacks and local interconnects are located below the dielectric capping layer 412 are pointed out. A SAGE wall 408 between the two pairs of fins 404 has three TFRs formed thereon. Each of the TFRs includes the metal layer 418 (beneath the dielectric capping layer 412) isolated by a pair of dielectric plugs 416.

An anode contact 420 and a cathode contact 422 are electrically connected to the metal layer 418 of each of the TFRs, between a corresponding pair of the dielectric plugs 416. It is to be appreciated that the TFRs 414 may be connected in series or in parallel, depending on the routing of interconnect layers above and coupled to the anode contacts 420 and the cathode contacts 422. Also shown in FIG. 5A is an exemplary trench contact region 430, as described in greater detail below in association with FIG. 5B.

Figure 5B:
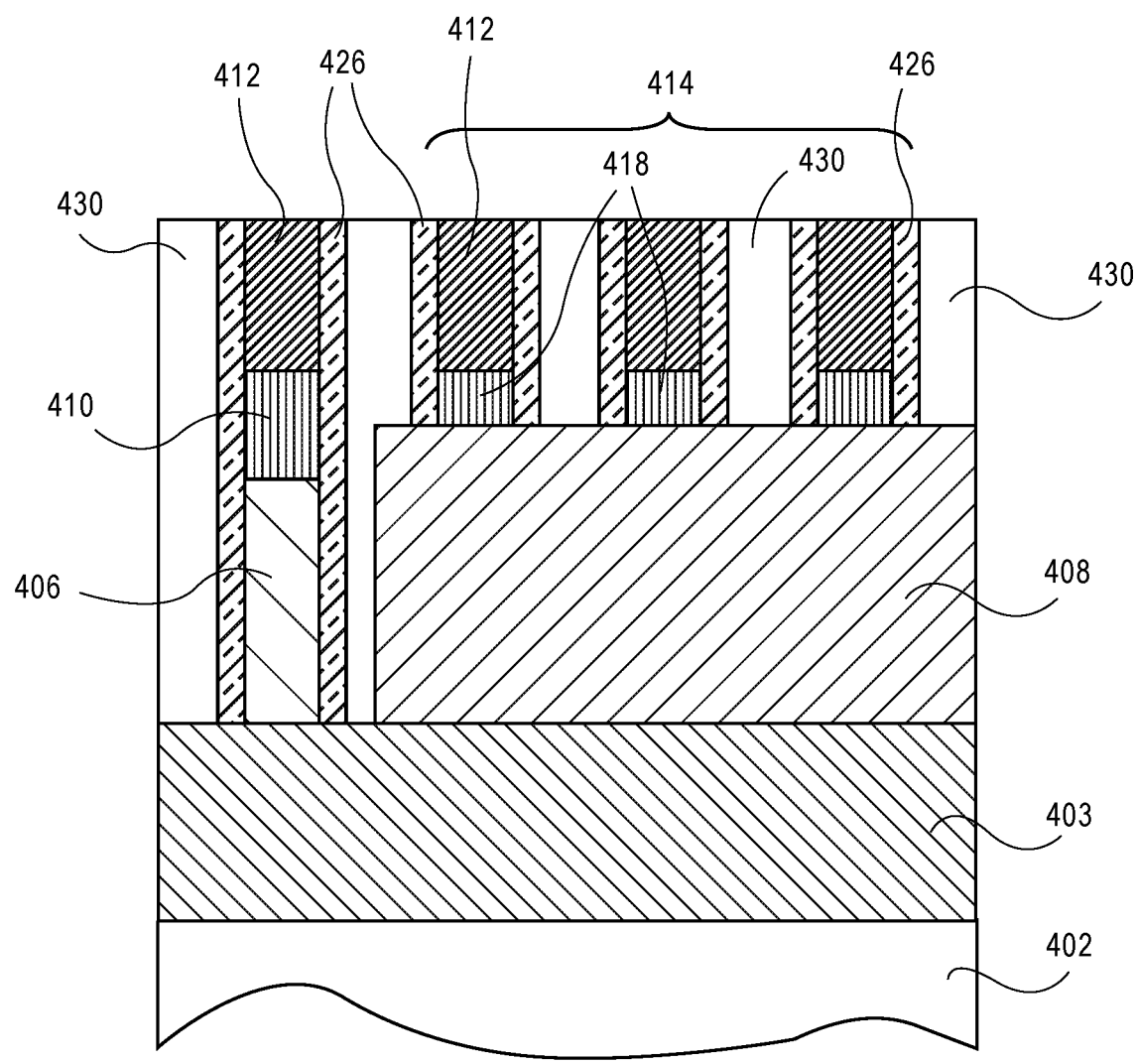
FIG. 5B illustrates a cross-sectional view of the semiconductor structure of FIG. 5A, as taken through a gate cut perspective, in accordance with an embodiment of the present invention.

FIG. 5B illustrates a cross-sectional view of the semiconductor structure of FIG. 5A, as taken through a gate cut perspective, in accordance with an embodiment of the present invention.

Referring to FIG. 5B, it is to be appreciated that semiconductor fins 404 are not seen in this perspective, since the cross-section is taken between adjacent semiconductor fins. However, cross-sectional views of a plurality of gate lines are shown, with the far left gate line adjacent to but not over the SAGE wall 408, and the three gate lines on the right going over the SAGE wall 408. Sidewall dielectric spacers 426 are included along the sidewalls of each of the gate lines.

The gate line on the far left includes the gate stack 406 having a local interconnect and the dielectric capping layer 412 thereon. A trench contact 430 is formed laterally adjacent to the sidewall spacer 418 of the gate stack 406. The trench contact 430 may be coupled to a source region or a drain region (not shown) of one or more fins of a transistor associated with gate stack 406.

The three gate lines on the right include the metal 418 of the TFRs 414 having the dielectric capping layer 412 thereon. Trench contact material may be included between the dielectric spacers 426 of each of the TFRs 414. It is to be appreciated that the dielectric plugs 416 isolating the metal layers 418 of each of the corresponding TFRs 414 are not shown since the cross-section is taken between each corresponding pair of dielectric plugs 416. Likewise, the anode contact 420 and a cathode contact 422 electrically connected to the metal layer 418 of each of the TFRs are not shown since the cross-section is taken between each corresponding pair of anode contacts 420 and cathode contacts 422.

In another aspect, the SAGE wall on which a TFR is fabricated may be formed on a SAGE wall that is slightly or substantially embedded in an isolation regions separating adjacent fins of a semiconductor structure. Additionally, or alternatively, the SAGE wall on which a TFR is fabricated may be formed on a SAGE wall composed of more than one dielectric layer.

Figure 6:
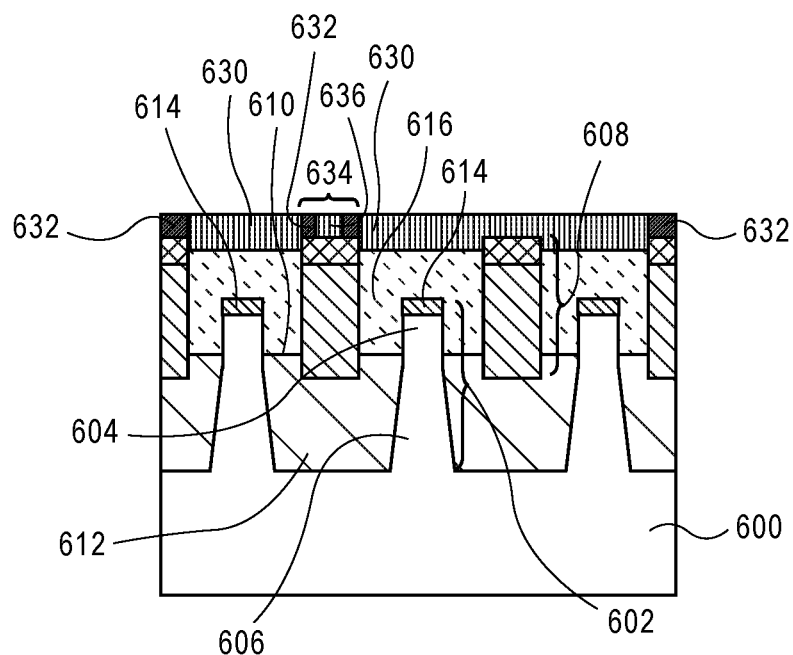
FIG. 6 illustrates a cross-sectional view of another semiconductor structure including a self-aligned gate edge (SAGE)-integrated thin film resistor, as taken through a fin cut perspective, in accordance with another embodiment of the present invention.

In a first example involving recess of a multi-layer SAGE wall, FIG. 6 illustrates a cross-sectional view of another semiconductor structure including a self-aligned gate edge (SAGE)-integrated thin film resistor, as taken through a fin cut perspective, in accordance with another embodiment of the present invention.

Referring to FIG. 6, a plurality of fins 602 is protruding from a substrate 600. Each of the plurality of fins 602 has an upper portion 604 and a lower portion 606. The upper portions 604 are between but lower than gate edge isolation structures (gate walls) 608. Also, the upper portions 604 are above an uppermost surface 610 of a trench isolation region 612. Although shown as retained in FIG. 6, it is to be appreciated that a top fin hardmask 614 can be removed prior to or during gate structure 616 formation. That is, top fin hardmask 614 may be removed to provide a tri-gate finFET device, or may ultimately be retained to provide a double gate finFET device.

Each of the SAGE walls 608 includes an upper layer 620 and a lower layer 622. The lower layer 622 of each of the SAGE walls 608 is slightly embedded in isolation region 612, below the uppermost surface 610 of the isolation region 612. The upper layer 620 of each SAGE wall 608 may include one or more of a local interconnect 630, a dielectric plug 632 or a TFR metal layer 636 formed thereon. An exemplary structure is shown with a TFR 634 shown formed on one of the SAGE walls 608.

Referring again to FIG. 6, in an embodiment, the SAGE process flow follows a conventional FINFET flow through fin patterning and shallow trench isolation (STI) recess. Subsequently, disposable spacers are deposited around the fins to define the gate endcap size. This is followed by filling the end-to-end space with a low dielectric constant material (e.g., SiN/SiOCN) and an etch resistant cap (e.g. metal oxides), which together form the SAGE wall. In one embodiment, the dielectric constant of the wall core (lower portion 622) is low to minimize fringe capacitance, and the top of the wall (upper portion 622 has an etch resistant cap to minimize wall erosion during downstream processing. A SAGE planarization or polish operation defines the height of the wall above fin. After the SAGE polish operation, the disposable spacers are removed. A gate stack is then formed and subsequently recessed to a height below the height of the gate edge isolation structures 608. In another embodiment, the gate stack is first processed through a replacement gate process and then ultimately subjected to a recessing to a height below the height of the gate edge isolation structures 608. In either case, in accordance with an embodiment of the present invention, following subsequent processing, the plurality of gate edge isolation structures 608 breaks a continuity of the gate stack or ultimate permanent gate structure into segments, as shown in FIG. 6. A local interconnect layer is then formed over the gate structure and over the plurality of gate edge isolation. The local interconnect electrically connects one or more segments of the gate structure. In one embodiment, the method further includes forming a one or more dielectric plugs that break a continuity of the local interconnect and to form isolated metal regions for TFR fabrication.

Figure 7:
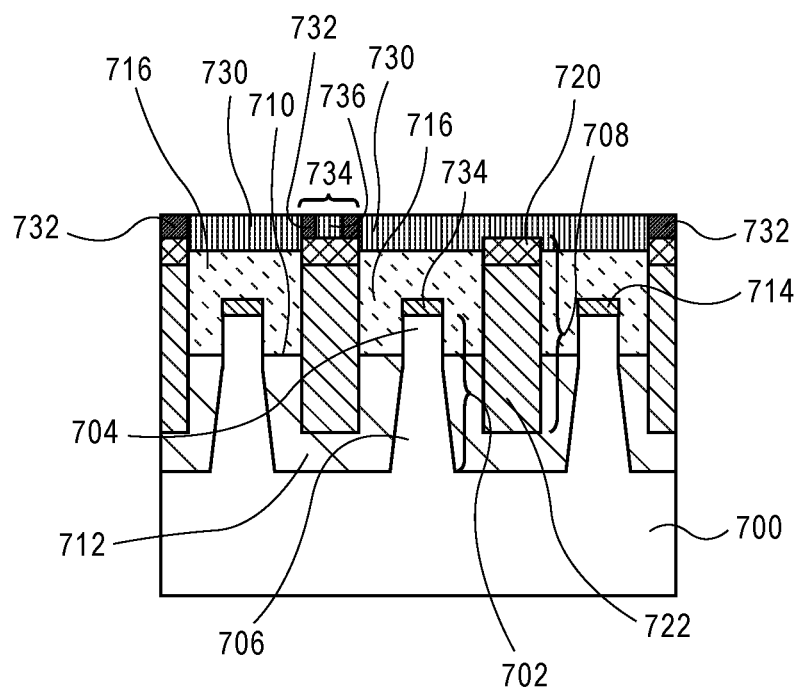
FIG. 7 illustrates a cross-sectional view of another semiconductor structure including a self-aligned gate edge (SAGE)-integrated thin film resistor, as taken through a fin cut perspective, in accordance with another embodiment of the present invention.

In a second example involving recess of a multi-layer SAGE wall, FIG. 7 illustrates a cross-sectional view of another semiconductor structure including a self-aligned gate edge (SAGE)-integrated thin film resistor, as taken through a fin cut perspective, in accordance with another embodiment of the present invention.

Referring to FIG. 7, a plurality of fins 702 is protruding from a substrate 700. Each of the plurality of fins 702 has an upper portion 704 and a lower portion 706. The upper portions 704 are between but lower than gate edge isolation structures (gate walls) 708. Also, the upper portions 704 are above an uppermost surface 710 of a trench isolation region 712. Although shown as retained in FIG. 7, it is to be appreciated that a top fin hardmask 714 can be removed prior to or during gate structure 716 formation. That is, top fin hardmask 714 may be removed to provide a tri-gate finFET device, or may ultimately be retained to provide a double gate finFET device.

Each of the SAGE walls 708 includes an upper layer 720 and a lower layer 722. The lower layer 722 of each of the SAGE walls 08 is substantially embedded in isolation region 712, below the uppermost surface 710 of the isolation region 712. The upper layer 720 of each SAGE wall 708 may include one or more of a local interconnect 730, a dielectric plug 732 or a TFR metal layer 736 formed thereon. An exemplary structure is shown with a TFR 734 shown formed on one of the SAGE walls 708.

Referring again to FIG. 7, in an embodiment, the SAGE process flow involves the fabrication of disposable dielectric spacers immediately after fin patterning. This is followed by SAGE wall film deposition and SAGE polish. It is to be appreciated that STI polish may not be needed in this flow, since the isolation region 712 is fabricated after spacer definition. In one embodiment, the SAGE wall is buried deep into STI and, thus, SAGE wall integrity may be improved. A gate stack is then formed and subsequently recessed to a height below the height of the gate edge isolation structures 708. In another embodiment, the gate stack is first processed through a replacement gate process and then ultimately subjected to a recessing to a height below the height of the gate edge isolation structures 708. In either case, in accordance with an embodiment of the present invention, following subsequent processing, the plurality of gate edge isolation structures 708 breaks a continuity of the gate stack or ultimate permanent gate structure into segments, as shown in FIG. 7. A local interconnect layer is then formed over the gate structure and over the plurality of gate edge isolation. The local interconnect electrically connects one or more segments of the gate structure. In one embodiment, the method further includes forming a one or more dielectric plugs that break a continuity of the local interconnect and to form isolated metal regions for TFR fabrication.

More generally, one or more embodiments described herein provide an avenue for area scaling, reducing capacitance, and/or eliminating various critical front end masks, such as gate cut masks. In one such embodiment the width of a minimum transistor can be reduced by up to 30% by implementing one or more of the approaches describe herein. The smaller transistor size reduces the capacitance between the gate and TCN and other parasitic capacitances. In one embodiment, no extra mask steps are needed to create the endcaps, contacts and local interconnect lines so the many masks needed for such features in the standard process are eliminated.

More specifically, key features of one or more embodiments described above may include one or more of: (1) the gate endcap is the distance from the fin edge to the isolation edge. This distance is defined by the spacer width and is the same size for all transistors. No lithographic patterning is needed to define the endcap so there is no need to allow for mask registration in the endcap; (2) The TCN overlap of the fin is determined by the spacer width and is also not affected by mask registration; (3) The local interconnect lines are self-aligned to the gate and TCN by utilizing the gate patterning lines above the transistor isolation walls. Embodiments may be applicable to the 7 nm node generation, e.g., to improve transistor layout density and gate capacitance (dynamic energy and performance improvement) and reduce total mask count.

Figure 8A:
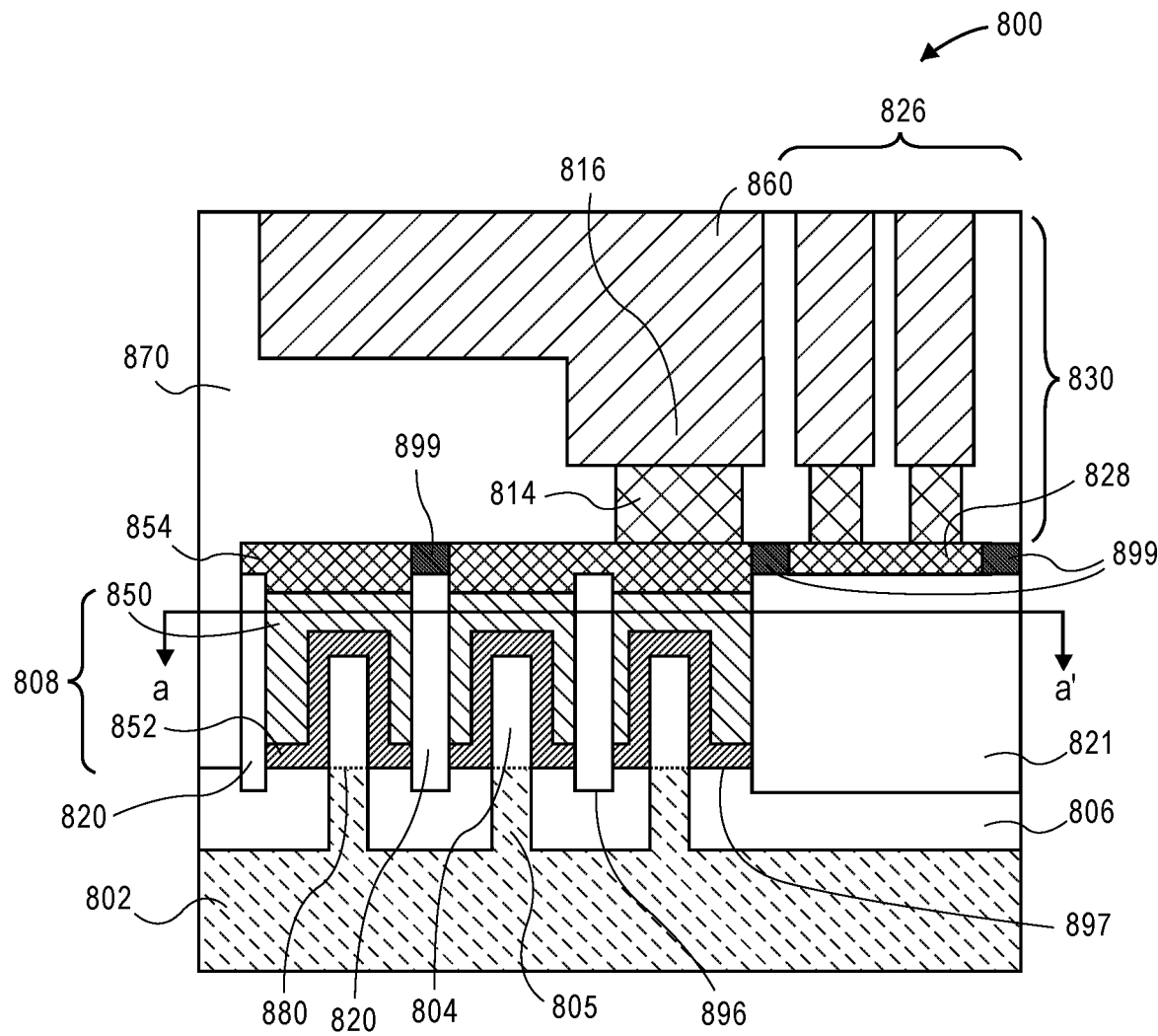
FIG. 8A illustrates a cross-sectional view of a non-planar semiconductor device having self-aligned gate edge isolation integrated with a self-aligned gate edge (SAGE)-integrated thin film resistor, in accordance with an embodiment of the present invention.
Figure 8B:
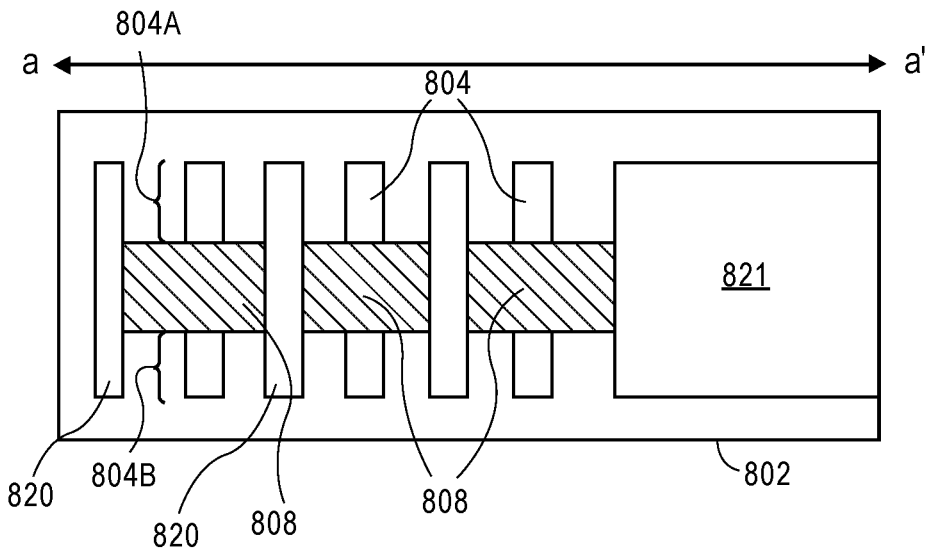
FIG. 8B illustrates a plan view taken along the a-a' axis of the structure of FIG. 8A, in accordance with an embodiment of the present invention.

It is to be appreciated that the structures resulting from the above exemplary processing schemes may be used in a same or similar form for subsequent processing operations to complete device fabrication, such as PMOS and NMOS device fabrication. As an example of a completed device, FIG. 8A illustrates a cross-sectional view of a non-planar semiconductor device having self-aligned gate edge isolation integrated with a self-aligned gate edge (SAGE)-integrated thin film resistor, in accordance with an embodiment of the present invention. FIG. 8B illustrates a plan view taken along the a-a' axis of the structure of FIG. 8A, in accordance with an embodiment of the present invention.

Referring to FIG. 8A, a semiconductor structure or device 800 includes a non-planar active regions (e.g., a fin structures including protruding fin portion 804 and sub-fin-region 805) formed from substrate 802, and within isolation region 806. In an embodiment, the fin structures are a plurality of fin lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like fin patterns may have lines spaced at a constant pitch and having a constant width. The pattern may be fabricated by a pitch halving or pitch quartering, or other pitch division, approach.

Gate structures 808 are disposed over the protruding portions 804 of the non-planar active regions as well as over a portion of the isolation region 806. As shown, gate structures 808 include a gate electrode 850 and a gate dielectric layer 852. In one embodiment, although not shown, gate structures 808 may also include a dielectric cap layer.

Gate structures 808 are separated by narrow self-aligned gate edge (SAGE) isolation structures or walls 820 or wide SAGE isolation structures or walls 821. A TFR 826 is formed on the wide SAGE wall 821 of FIG. 8A. Each SAGE wall 820 or 821 may include one or more of a local interconnect 854, a dielectric plug 899 or a TFR metal layer 828 formed thereon. An exemplary structure is shown with a TFR 826 formed on the wide SAGE wall 821. The TFR 826 includes a metal layer 828 isolated by a pair of dielectric plugs 899. An anode and cathode contact pair 830 is electrically connected to the metal layer 828 of the TFR 826. In an embodiment, each of the SAGE walls 820 and 821 is recessed below an uppermost surface 897 of the isolation region 806, as is depicted in FIG. 8A.

A gate contact 814, and overlying gate contact via 816 are also seen from this perspective, along with an overlying metal interconnect 860, all of which are disposed in interlayer dielectric stacks or layers 870. Also seen from the perspective of FIG. 8A, the gate contact 814 is, in one embodiment, disposed over the non-planar active regions. As is also depicted in FIG. 8A, an interface 880 exists between a doping profile of protruding fin portions 804 and sub-fin regions 805, although other embodiments do not include such an interface in doping profile between these regions.

Referring to FIG. 8B, the gate structures 808 are shown as disposed over the protruding fin portions 804, as isolated by self-aligned gate edge isolation structures 820 and 821. In an embodiment, the gate structures 808 form one line of a plurality of parallel gate lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like gate patterns may have lines spaced at a constant pitch and having a constant width. The pattern may be fabricated by a pitch halving or pitch quartering, or other pitch division, approach.

Referring again to FIG. 8B, source and drain regions 804A and 804B of the protruding fin portions 804 are shown in this perspective, although it is to be appreciated that these regions would be overlapped with trench contact structures. In one embodiment, the source and drain regions 804A and 804B are doped portions of original material of the protruding fin portions 804. In another embodiment, the material of the protruding fin portions 804 is removed and replaced with another semiconductor material, e.g., by epitaxial deposition. In either case, the source and drain regions 804A and 804B may extend below the height of dielectric layer 806, i.e., into the sub-fin region 805.

In an embodiment, the semiconductor structure or device 800 is a non-planar device such as, but not limited to, a finFET or a tri-gate device. In such an embodiment, a corresponding semiconducting channel region is composed of or is formed in a three-dimensional body. In one such embodiment, the gate structures 808 surround at least a top surface and a pair of sidewalls of the three-dimensional body.

Substrate 802 may be composed of a semiconductor material that can withstand a manufacturing process and in which charge can migrate. In an embodiment, substrate 802 is a bulk substrate composed of a crystalline silicon, silicon/germanium or germanium layer doped with a charge carrier, such as but not limited to phosphorus, arsenic, boron or a combination thereof, to form active region 804. In one embodiment, the concentration of silicon atoms in bulk substrate 802 is greater than 97%. In another embodiment, bulk substrate 802 is composed of an epitaxial layer grown atop a distinct crystalline substrate, e.g. a silicon epitaxial layer grown atop a boron-doped bulk silicon mono-crystalline substrate. Bulk substrate 802 may alternatively be composed of a group III-V material. In an embodiment, bulk substrate 802 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 802 is composed of a material and the charge-carrier dopant impurity atoms are ones such as, but not limited to, carbon, silicon, germanium, oxygen, sulfur, selenium or tellurium.

Isolation region 806 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 806 is composed of a dielectric material such as, but not limited to, silicon dioxide, silicon oxy-nitride, silicon nitride, or carbon-doped silicon nitride.

Self-aligned gate edge isolation structures 820 and 821 may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Gate structures 808 may be composed of a gate electrode stack which includes a gate dielectric layer 852 and a gate electrode layer 850. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 802. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Local interconnect 854 and/or TFR metal 828 may be composed of titanium nitride (TiN) or tungsten (W), as described above. It is to be appreciated that a hardmask layer may be disposed on the local interconnect 854 and the TFR metal 828 in locations where gate contact 814 or the TFR contacts 830 are not located thereon. It is to be appreciated that other metals may be used for TFR metal 828 in place of, or in combination with, titanium nitride (TiN) or tungsten (W).

Gate contact 814, overlying gate contact via 816, overlying metal interconnect 860 and TFR contacts 830 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc.

In an embodiment (although not shown), providing structure 800 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate structures 808 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 800. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 8A, in an embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that, as exemplified in FIGS. 8A and 8B, SAGE walls of varying width may be fabricated, e.g., relatively narrow SAGE walls 820 and relatively wide SAGE walls 821. It is also to be appreciated that fabrication of gate edge isolation structures may lead to formation of a seam within the gate edge isolation structures. It is also to be appreciated that gate edge isolation structures may differ depending on the spacing of adjacent fins. As an example covering both aspects, FIGS. 9A-9C illustrate cross-sectional views of process operations of significance in another self-aligned gate edge process fabrication scheme for finFET or tri-gate devices, in accordance with an embodiment of the present invention.

Figure 9A:
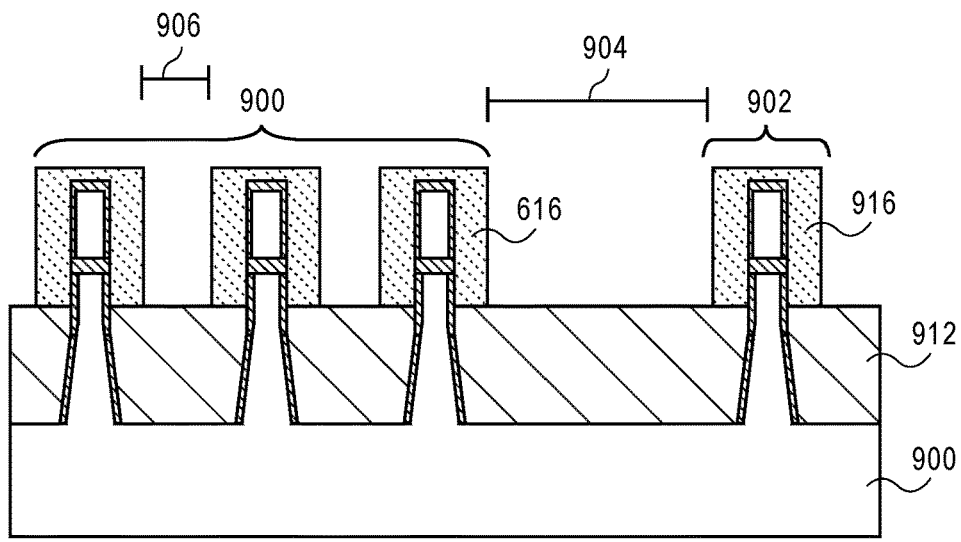
FIGS. 9A-9C illustrate cross-sectional views of process operations of significance in another self-aligned gate edge process fabrication scheme for finFET or tri-gate devices, in accordance with an embodiment of the present invention.

Referring to FIG. 9A, a grouping of fins 900 has a spacing 906. The grouping of fins 900 is adjacent to a fin 902 by a larger spacing 904. Sacrificial spacers 916 are formed adjacent to sidewalls of the upper portions of each of plurality of semiconductor fins 900 and 902.

Figure 9B:
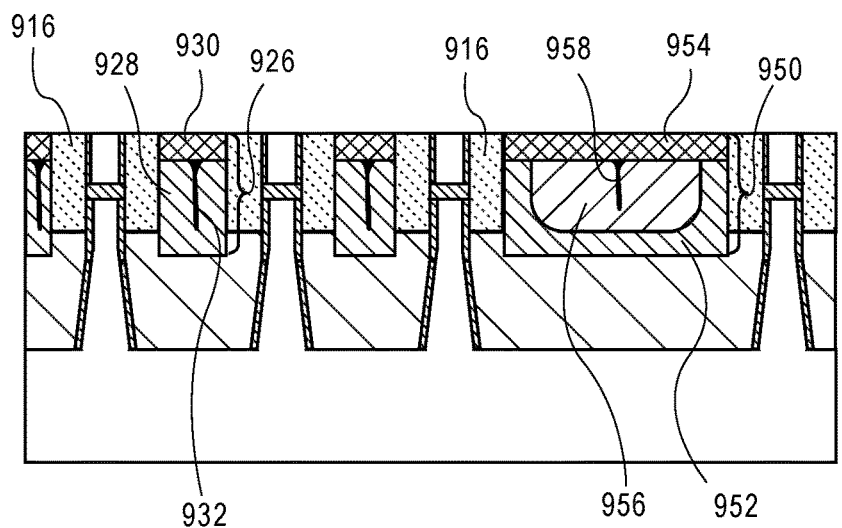
Figure 9C:
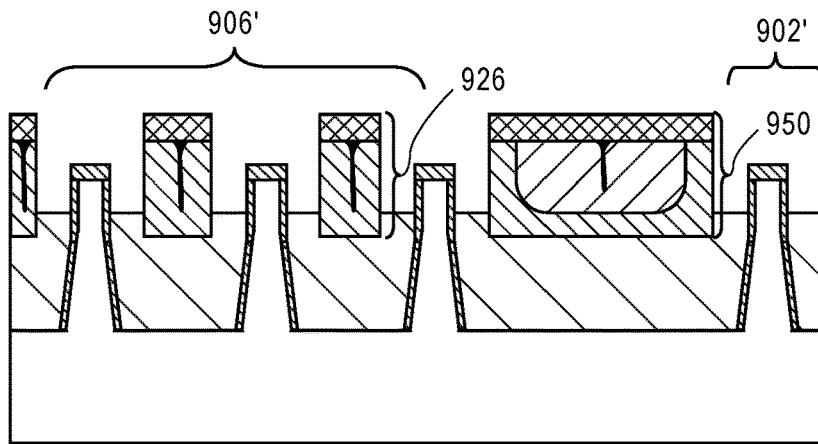

Referring to FIG. 9B, a plurality of gate edge isolation structures 926 and 950 is formed between the sacrificial spacers 616. In an embodiment, as depicted, each of the plurality of gate edge isolation structures 926 formed between spacings 906 includes a lower dielectric portion 928 and a dielectric cap 930 on the lower dielectric portion 928. In an embodiment, the plurality of gate edge isolation structures 926 is formed by depositing and then recessing a first dielectric material, such as a silicon nitride layer, to provide the lower dielectric portions 928. The deposition process may be a conformal process which, in one embodiment, provides seams 932 within the lower dielectric portion 928. Thus, in an embodiment, each of the plurality of gate edge isolation structures 926 includes a vertical seam 932 centered within the gate edge isolation structure 926. A dielectric cap material, such as a metal oxide material (e.g., hafnium oxide) is then formed in recessed regions above the lower dielectric portions 928. The dielectric cap material may be planarized to form the dielectric cap 930 or may be grown upward to provide the dielectric cap 930 directly.

Referring again to FIG. 9B, in an embodiment, a gate edge isolation structure 926 is between semiconductor fins having a spacing 906 and a gate edge isolation structure 950 is between semiconductor fins having a spacing 904. The gate edge isolation structure 926 has a width narrower than a corresponding width of gate edge isolation structure 950. In one embodiment, the gate edge isolation structure 926 has a total composition different than a total composition of the gate edge isolation structure 950. In one such embodiment, gate edge isolation structure 950 further includes a third dielectric layer 956, such as a layer of silicon oxide on a bottom portion of and within sidewalls of a lower dielectric portion 952. A dielectric cap 952 is further on the third dielectric layer 956. In an embodiment, the sidewalls of the lower dielectric portion 952 have an uppermost surface approximately co-planar with an uppermost surface of the third dielectric layer 956, and the dielectric cap 952 has a substantially planar bottommost surface, as is depicted in FIG. 9B. In another embodiment, the sidewalls of the lower dielectric portion 952 have an uppermost surface below an uppermost surface of the third dielectric layer 956, and the dielectric cap 952 extends further down over the sidewall locations. In yet another embodiment, the sidewalls of the lower dielectric portion 952 have an uppermost surface above an uppermost surface of the third dielectric layer 956, and the dielectric cap 952 extends further down over the third dielectric layer 956.

In an embodiment, the deposition process of layer 956 is a conformal process which, in one embodiment, provides vertical seams 958 within the third dielectric layer 956. However, in another embodiment, a seam 958 is not formed in wider structures but is formed in narrower structures (e.g., seam 932 described above). It is to be appreciated that layers 928 and 952 may be composed of a same material, such as silicon nitride, and formed at a same time as one another. It is also to be appreciated that layers 930 and 954 may be composed of a same material, such as hafnium oxide, and formed at a same time as one another. The third dielectric layer 956 in structure 950 but omitted from structure 926 may be formed by conformal deposition across the entire structure but is excluded from structures 926 since the layer 928 essentially fills the spacing 906 in a first deposition process which does not entirely fill the spacing 904.

Referring to FIG. 9C, the sacrificial spacers 616 are removed. In an embodiment, the sacrificial spacers 616 are removed by a wet etch or dry etch process. In an embodiment, patterning stack layers above the fins are also removed to provide fins 906' and 902'. Thus, in an embodiment, a gate edge isolation structure includes a vertical seam within the gate edge isolation structure. In an embodiment, gate edge isolation structures differ in width and/or composition depending on the spacing of adjacent fins. In accordance with an embodiment of the present invention a TFR is subsequently fabricated on one or more of the SAGE walls 926 or 950, e.g., following a gate electrode fabrication process.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers may be formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon. ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc.

Each of the processor, the memory, and the chipset, may potentially be manufactured using the approaches disclosed herein.

Figure 10:
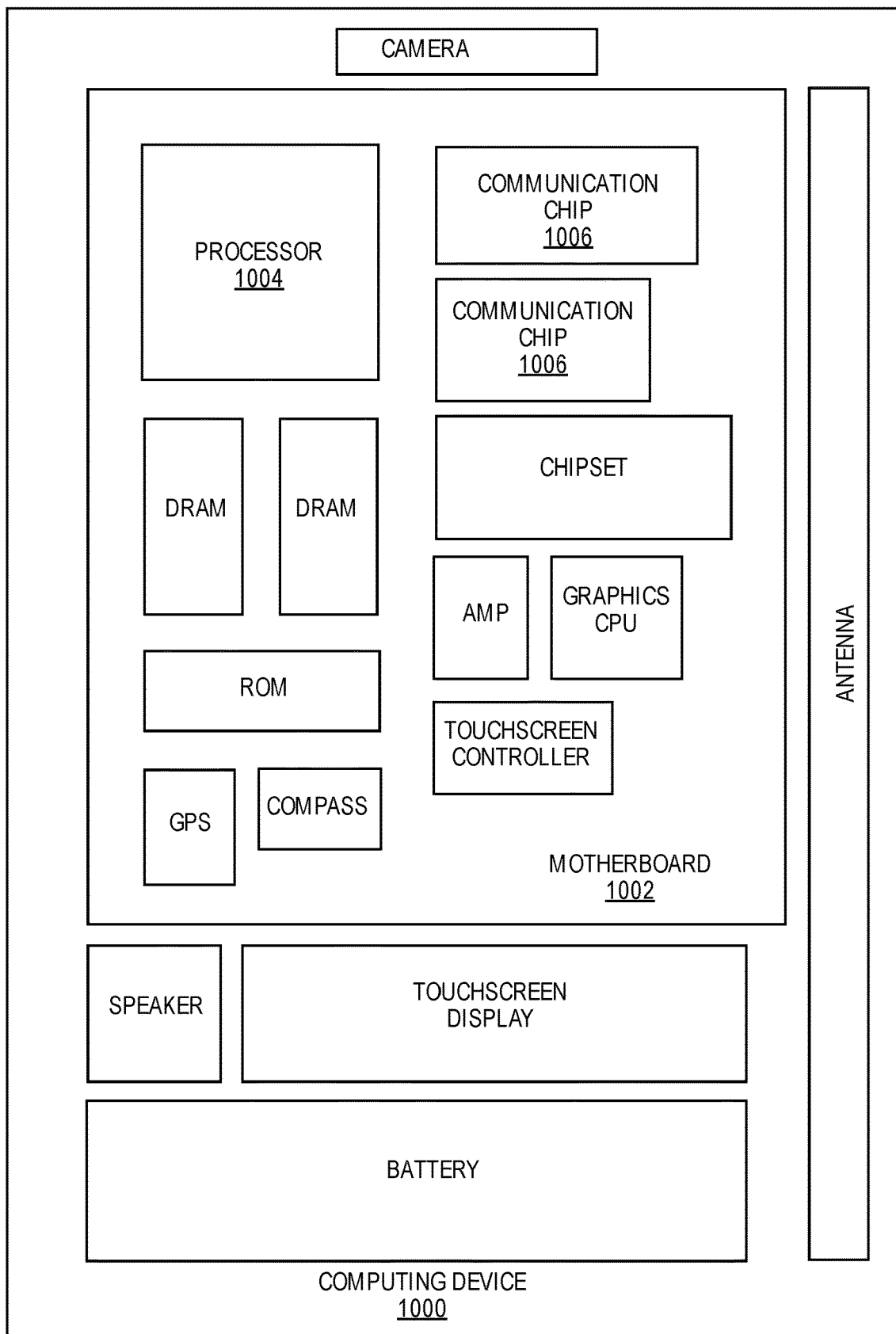
FIG. 10 illustrates a computing device in accordance with one implementation of an embodiment of the present invention.

FIG. 10 illustrates a computing device 1000 in accordance with one implementation of an embodiment of the present invention. The computing device 1000 houses a board 1002. The board 1002 may include a number of components, including but not limited to a processor 904 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. The integrated circuit die of the processor 1004 may include one or more structures, such as self-aligned gate edge (SAGE)-integrated thin film resistors (TFRs) built in accordance with implementations of embodiments of the present invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. The integrated circuit die of the communication chip 1006 may include one or more structures, such as self-aligned gate edge (SAGE)-integrated thin film resistors (TFRs) built in accordance with implementations of embodiments of the present invention.

In further implementations, another component housed within the computing device 1000 may contain an integrated circuit die that includes one or structures, such as self-aligned gate edge (SAGE)-integrated thin film resistors (TFRs) built in accordance with implementations of embodiments of the present invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
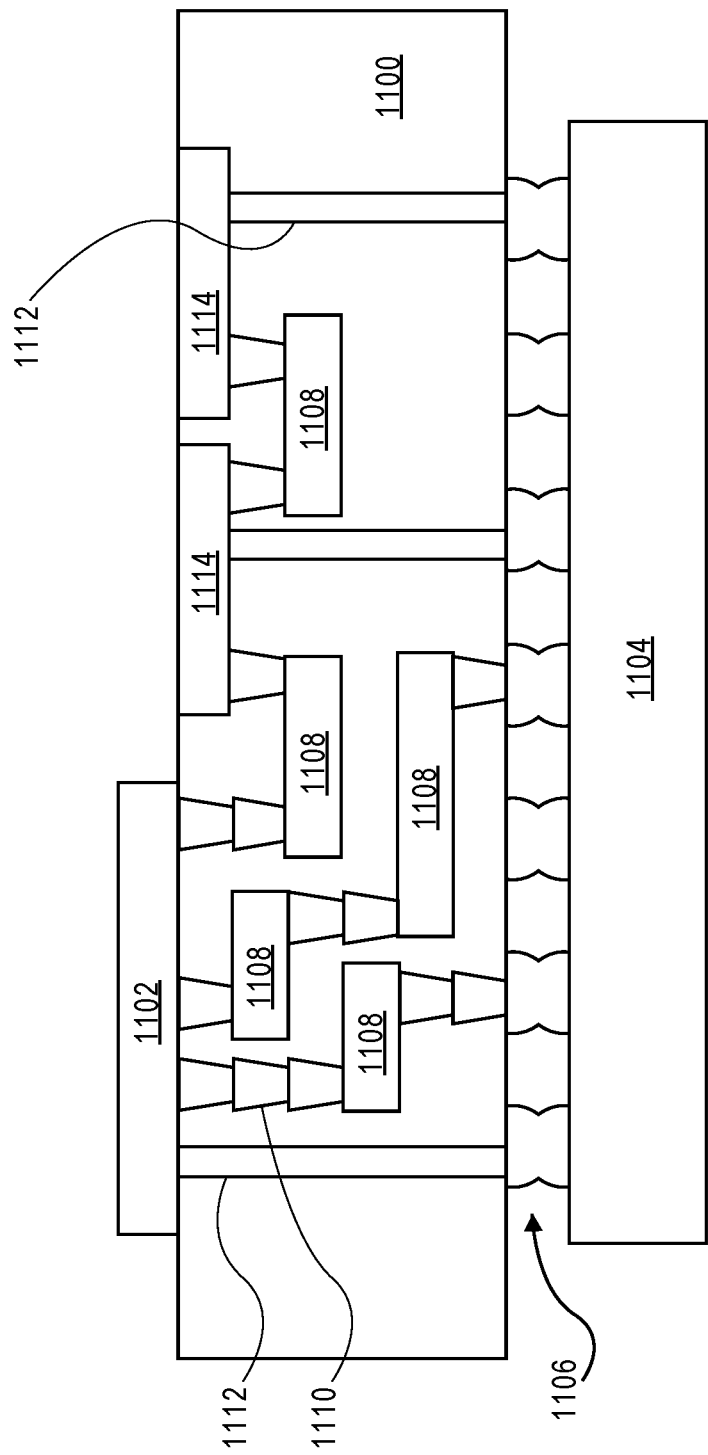
FIG. 11 illustrates an interposer that includes one or more embodiments of the present invention.

FIG. 11 illustrates an interposer 1100 that includes one or more embodiments of the present invention. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the invention, apparatuses or processes disclosed herein may be used in the fabrication of interposer 1100 or in the fabrication of components included in the interposer 1100.

Thus, embodiments of the present invention include metal resistors and self-aligned gate edge (SAGE) architectures having metal resistors.

Example Embodiment 1

A semiconductor structure includes a plurality of semiconductor fins protruding through a trench isolation region above a substrate. A first gate structure is over a first of the plurality of semiconductor fins. A second gate structure is over a second of the plurality of semiconductor fins. A gate edge isolation structure is laterally between and in contact with the first gate structure and the second gate structure. The gate edge isolation structure is on the trench isolation region and extends above an uppermost surface of the first gate structure and the second gate structure. A metal layer is on the gate edge isolation structure and is electrically isolated from the first gate structure and the second gate structure.

Example Embodiment 2

The semiconductor structure of example embodiment 1, further including a local interconnect on one of the first gate structure or the second gate structure, the local interconnect laterally adjacent to and isolated from the metal layer.

Example Embodiment 3

The semiconductor structure of example embodiment 2, wherein the local interconnect and the metal layer on the gate edge isolation structure are composed of a same material.

Example Embodiment 4

The semiconductor structure of example embodiment 2, wherein the local interconnect and the metal layer on the gate edge isolation structure are composed of a different material.

Example Embodiment 5

The semiconductor structure of example embodiment 1, 2, 3 or 4, wherein the metal layer on the gate edge isolation structure includes titanium nitride (TiN) or tungsten (W).

Example Embodiment 6

The semiconductor structure of example embodiment 1, 2, 3, 4 or 5, wherein the metal layer directly on the gate edge isolation structure has a resistivity approximately in the range of 100-100,000 ohms/square.

Example Embodiment 7

The semiconductor structure of example embodiment 1, 2, 3, 4, 5 or 6, wherein the metal layer directly on the gate edge isolation structure is isolated from the first gate structure and the second gate structure by a pair of dielectric plugs.

Example Embodiment 8

The semiconductor structure of example embodiment 1, 2, 3, 4, 5, 6 or 7, further including an anode and cathode pair electrically coupled to the metal layer directly on the gate edge isolation structure.

Example Embodiment 9

A semiconductor structure includes one or more semiconductor devices including a plurality of gate structures above a substrate. A local interconnect is on and electrically couples two of more of the plurality of gate structures. A thin film resistor (TFR) is laterally adjacent to the local interconnect. The TFR is electrically isolated from the plurality of gate structures and from the local interconnect.

Example Embodiment 10

The semiconductor structure of example embodiment 9, wherein the local interconnect and the TFR are composed of a same material.

Example Embodiment 11

The semiconductor structure of example embodiment 9, wherein the local interconnect and the TFR are composed of a different material.

Example Embodiment 12

The semiconductor structure of example embodiment 9, 10 or 11, wherein the TFR includes a titanium nitride (TiN) layer or a tungsten (W) layer.

Example Embodiment 13

The semiconductor structure of example embodiment 9, 10, 11 or 12, wherein the TFR includes a metal layer having a resistivity approximately in the range of 100-100,000 ohms/square.

Example Embodiment 14

The semiconductor structure of example embodiment 9, 10, 11, 12 or 13, wherein the TFR is electrically isolated from the plurality of gate structures by a gate edge isolation structure, and wherein the TFR is electrically isolated from the local interconnect by a pair of dielectric plugs.

Example Embodiment 15

The semiconductor structure of example embodiment 9, 10, 11, 12, 13 or 14, wherein the TFR includes an anode and cathode pair electrically coupled to a metal resistor layer, the metal resistor layer laterally adjacent to the local interconnect.

Example Embodiment 16

A semiconductor structure includes a plurality of semiconductor devices above a substrate. A plurality of interconnect metallization layers is above the plurality of semiconductor devices. A plurality of thin film resistors (TFRs) is above the plurality of semiconductor devices and below the plurality of interconnect metallization layers. The plurality of TFRs is electrically isolated from the plurality of semiconductor devices. Two or more of the plurality of TFRs are electrically coupled together through one or more of the plurality of interconnect metallization layers.

Example Embodiment 17

The semiconductor structure of example embodiment 16, wherein the two or more of the plurality of TFRs are coupled together in series.

Example Embodiment 18

The semiconductor structure of example embodiment 16, wherein the two or more of the plurality of TFRs are coupled together in parallel.

Example Embodiment 19

The semiconductor structure of example embodiment 16, 17 or 18, wherein the plurality of TFRs is on one or more self-aligned gate edge (SAGE) isolation structures.

Example Embodiment 20

The semiconductor structure of example embodiment 19, wherein each of the one or more SAGE isolation structures includes an upper dielectric layer on a lower dielectric layer, the upper dielectric layer having a greater dielectric constant than the lower dielectric layer.

Example Embodiment 21

The semiconductor structure of example embodiment 19 or 20, wherein each of the one or more SAGE isolation structures includes a vertical seam centered within the SAGE isolation structure.

Example Embodiment 22

The semiconductor structure of example embodiment 16, 17 or 18, further including a wide gate edge isolation structure and a narrow gate edge isolation structure, wherein the plurality of TFRs is on wide gate edge isolation structure.

Example Embodiment 23

The semiconductor structure of example embodiment 16, 17, 18, 19, 20, 21 or 22, further including a plurality of local interconnects above the plurality of semiconductor devices and below the plurality of interconnect metallization layers, the plurality of local interconnects isolated from the plurality of TFRs.

Example Embodiment 24

The semiconductor structure of example embodiment 16, 17, 18, 19, 20, 21, 22 or 23, wherein the plurality of semiconductor devices includes a plurality of semiconductor fins.

What is claimed is:

1. A semiconductor structure, comprising:
    a plurality of semiconductor fins protruding through a trench isolation region above a substrate;
    a first gate structure over a first of the plurality of semiconductor fins;
    a second gate structure over a second of the plurality of semiconductor fins;
    a gate edge isolation structure laterally between and in contact with the first gate structure and the second gate structure, the gate edge isolation structure on the trench isolation region and extending above an uppermost surface of the first gate structure and the second gate structure; and
    a metal layer on the gate edge isolation structure and electrically isolated from the first gate structure and the second gate structure.

2. The semiconductor structure of claim 1, further comprising:
    a local interconnect on one of the first gate structure or the second gate structure, the local interconnect laterally adjacent to and isolated from the metal layer.

3. The semiconductor structure of claim 2, wherein the local interconnect and the metal layer on the gate edge isolation structure comprise a same material.

4. The semiconductor structure of claim 2, wherein the local interconnect and the metal layer on the gate edge isolation structure comprise a different material.

5. The semiconductor structure of claim 1, wherein the metal layer on the gate edge isolation structure comprises titanium nitride (TiN) or tungsten (W).

6. The semiconductor structure of claim 1, wherein the metal layer directly on the gate edge isolation structure has a resistivity approximately in the range of 100-100,000 ohms/square.

7. The semiconductor structure of claim 1, wherein the metal layer directly on the gate edge isolation structure is isolated from the first gate structure and the second gate structure by a pair of dielectric plugs.

8. The semiconductor structure of claim 1, further comprising: an anode and cathode pair electrically coupled to the metal layer directly on the gate edge isolation structure.

9. A semiconductor structure, comprising:
    one or more semiconductor devices comprising a plurality of gate structures above a substrate;
    a local interconnect on and electrically coupling two or more of the plurality of gate structures; and
    a thin film resistor (TFR) laterally adjacent to the local interconnect, the TFR electrically isolated from the plurality of gate structures and from the local interconnect.

10. The semiconductor structure of claim 9, wherein the local interconnect and the TFR comprise a same material.

11. The semiconductor structure of claim 9, wherein the local interconnect and the TFR comprise a different material.

12. The semiconductor structure of claim 9, wherein the TFR comprises a titanium nitride (TiN) layer or a tungsten (W) layer.

13. The semiconductor structure of claim 9, wherein the TFR comprises a metal layer having a resistivity approximately in the range of 100-100,000 ohms/square.

14. The semiconductor structure of claim 9, wherein the TFR is electrically isolated from the plurality of gate structures by a gate edge isolation structure, and wherein the TFR is electrically isolated from the local interconnect by a pair of dielectric plugs.

15. The semiconductor structure of claim 9, wherein the TFR comprises an anode and cathode pair electrically coupled to a metal resistor layer, the metal resistor layer laterally adjacent to the local interconnect.

* * * * *